United States Patent
Bonds

(10) Patent No.: US 6,384,681 B1
(45) Date of Patent: May 7, 2002

(54) SWEPT PERFORMANCE MONITOR FOR MEASURING AND CORRECTING RF POWER AMPLIFIER DISTORTION

(75) Inventor: David Kent Bonds, Quincy, IL (US)

(73) Assignee: Spectrian Corporation, Sunnyvale, CA (US)

( * ) Notice: Subject to any disclaimer, the term of this patent is extended or adjusted under 35 U.S.C. 154(b) by 0 days.

(21) Appl. No.: 09/927,814

(22) Filed: Aug. 10, 2001

Related U.S. Application Data

(63) Continuation of application No. 09/703,176, filed on Oct. 31, 2000, which is a continuation-in-part of application No. 09/479,723, filed on Jan. 7, 2000.
(60) Provisional application No. 60/175,279, filed on Jan. 10, 2000.

(51) Int. Cl.[7] ............................................... H03F 1/26
(52) U.S. Cl. ...................... 330/149; 330/136; 375/297
(58) Field of Search ................................. 330/149, 136; 375/97

(56) References Cited

U.S. PATENT DOCUMENTS

| 4,885,551 | A | | 12/1989 | Myer ........................... 330/52 |
| 5,119,040 | A | * | 6/1992 | Long et al. ................. 330/149 |
| 5,489,875 | A | | 2/1996 | Cavers ........................ 330/151 |
| 5,565,814 | A | * | 10/1996 | Fukuchi ....................... 330/52 |
| 5,742,201 | A | | 4/1998 | Eisenberg et al. ............. 330/2 |
| 5,923,214 | A | | 7/1999 | Mitzlaff ....................... 330/52 |
| 5,929,704 | A | * | 7/1999 | Proctor, Jr. et al. ......... 330/149 |
| 6,078,216 | A | * | 6/2000 | Proctor, Jr. ................. 330/151 |
| 6,144,255 | A | * | 11/2000 | Patel et al. ................. 330/151 |

* cited by examiner

Primary Examiner—Robert Pascal
Assistant Examiner—Henry Choe
(74) Attorney, Agent, or Firm—Allen, Dyer, Doppelt, Milbrath & Gilchrist, P.A.

(57) ABSTRACT

RF power amplifier distortion is measured in the presence of multi-frequency input signals, by sweeping a local oscillator to tune RF input and output receivers. When the power detected by the input receiver exceeds a carrier energy threshold, the operation of a predistortion processor is blanked. This creates an adaptive notch filter, which allows for the direct measurement of low level distortion power in the presence of high power carriers. The unnecessary complexity of using controllably interrupted high isolation switches in the signal flow path of the output receiver in certain applications may be effectively obviated by buffer amplifier—passband filter stages. These buffer-filter stages provide additional gain to offset the fact that the signal level extracted from the output amplifier is very low, and prevent producing IMDs in the swept receiver's mixer. They are preferably implemented of the same bandpass filter in the swept input receiver.

19 Claims, 2 Drawing Sheets

SWEPT PERFORMANCE MONITOR FOR MEASURING AND CORRECTING RF POWER AMPLIFIER DISTORTION

CROSS-REFERENCE TO RELATED APPLICATION

This present application is a continuation of co-pending application, U.S. patent application Ser. No. 09/703,176 filed on Oct. 31, 2000, which is a continuation-in-part of co-pending U.S. patent application Ser. No. 09/479,723, filed on Jan. 7, 2000 (hereinafter referred to as the '723 application), and further claims the benefit of U.S. Provisional Patent Application Ser. No. 60/175,279, filed Jan. 10, 2000, each of which applications is assigned to the assignee of the present application and the disclosures of which are incorporated herein.

FIELD OF THE INVENTION

The present invention relates in general to radio frequency (RF) communication systems, and is particularly directed to an RF power amplifier distortion correction mechanism for controlling an adaptive digital signal processor-controlled pre-distortion circuit installed in the input path to an RF amplifier having a relatively "low" carrier to intermod ratio (C/I). The invention employs a swept oscillator to sweep input and output receivers, and locate and isolate the RF carrier component in the amplifier output, so that distortion energy produced at the output of the RF amplifier may be detected. Once detected, distortion energy may be controllably removed by the pre-distortion unit.

BACKGROUND OF THE INVENTION

As described in the above-referenced co-pending '723 application, specifications and regulations of the Federal Communications Commission (FCC) mandate that communication service providers comply with very strict bandwidth constraints, including the requirement that the amount of energy spillover outside a licensed channel or band of interest, be sharply attenuated (e.g., on the order of 50 dB). Although such limitations may be readily overcome for traditional forms of modulation, such as FM, they are difficult to achieve using more contemporary, digitally based modulation formats, such as M-ary modulation.

Attenuating sidebands sufficiently to meet industry or regulatory-based standards using such modulation techniques requires very linear signal processing systems and components. Although relatively linear components can be obtained at a reasonable cost for the relatively low bandwidths (baseband) of telephone networks, linearizing components such as power amplifiers at RF frequencies can be prohibitively expensive.

A fundamental difficulty in linearizing an RF power amplifier is the fact that it is an inherently non-linear device, and generates unwanted intermodulation distortion products (IMDs). IMDs manifest themselves as spurious signals in the amplified RF output signal, separate and distinct from the RF input signal. A further manifestation of IMD is spectral regrowth or spreading of a compact spectrum into spectral regions that were not occupied by the RF input signal. This distortion causes the phase-amplitude of the amplified output signal to depart from the phase-amplitude of the input signal, and may be considered as an incidental (and undesired) amplifier-sourced modulation of the RF input signal.

A straightforward way to implement a linear RF power amplifier is to build it as a large, high power device, but operate the amplifier at a only a low power level (namely, at a small percentage of its rated output power), where the RF amplifier s transfer function is relatively linear. An obvious drawback to this approach is the overkill penalty—a costly and large sized RF device. Other prior art techniques which overcome this penalty include feedback correction techniques, feedforward correction, and pre-distortion correction.

Feedback correction techniques include polar envelope correction (such as described in U.S. Pat. No. 5,742,201), and Cartesian feedback, where the distortion component at the output of the RF amplifier is used to directly modulate the input signal to the amplifier in real time. Feedback techniques possess the advantage of self-convergence, as do negative feedback techniques in other fields of design. However, systems which employ negative feedback remain stable over a limited bandwidth, which prevents their application in wide-bandwidth environments, such as multi-carrier or W-CDMA. Feedforward and predistortion correction, however, are not limited in this regard. In the feedforward approach, error (distortion) present in the RF amplifier's output signal is extracted, amplified to the proper level, and then reinjected with equal amplitude but opposite phase into the output path of the amplifier, so that (ideally) the RF amplifier's distortion is effectively canceled.

When predistortion correction is used, a signal is modulated onto the RF input signal path upstream of the RF amplifier. The characteristic of an ideal predistortion signal is the inverse of the distortion expected at the output of the high power RF amplifier, so that when subjected to the distorting transfer function of the RF amplifier, it effectively cancels the distortion behavior.

Either predistortion or feedforward may be made adaptive by extracting an error signal component in the output of the RF amplifier and then adjusting the control signal(s), in accordance with the extracted error behavior of the RF amplifier, so as to effectively continuously minimize distortion in the amplifier's output.

One conventional mechanism for extracting the error signal component involves injecting a pilot (tone) signal into the signal flow path through the amplifier and measure the amplifier's response. A fundamental drawback to the use of a pilot tone is the need for dedicated pilot generation circuitry and the difficulty of placing the pilot tone within the signal bandwidth of the amplifier. Other approaches employ a high intercept receiver to detect low level distortion in the presence of high power carriers, which adds substantial complexity and cost.

Pursuant to the invention described in the '723 application, RF power amplifier distortion in the presence of multi-frequency input signals is accurately measured by using a swept local oscillator to tune RF input and output receivers. Where that distortion is corrected by means of an adaptive predistortion circuit installed in the input path to an RF amplifier having a relatively "low" carrier to intermod ratio (C/I), the swept local oscillator scheme may be configured as diagrammatically shown in FIG. 1 (which corresponds to FIG. 1 of the '723 application). By relatively low C/I ratio RF amplifier is meant one whose RF carrier level is effectively indistinguishable from that of intermodulation products. As a non-limiting example, the term low C/I ratio may be considered to apply to those RF amplifiers having intermodulation products above −50 dBC.

In the architecture of FIG. 1, an RF input signal $RF_{in}$ to be amplified is coupled to an input port 11 of a signal input path to RF power amplifier 10, the distortion characteristic of which is to be measured by a controllably blanked distortion energy detector subsection 100. In order to monitor the RF input signal $RF_{in}$ for the presence of carrier energy, the RF input port 11 is coupled through a first directional coupler 13 to a first input 21 of a mixer 22 of a controllably tuned or swept input receiver 20, and to a digitally controlled predistortion unit 14 installed in the signal input path to RF power amplifier 10.

The predistortion unit 14 is operative to dynamically adjust the amplitude and phase of the RF input signal to the RF amplifier 10, and may contain a vector modulator driven by a complex polynomial work function. Predistortion unit 14 is coupled to receive weighting coefficients $w_0$, $w_1$, $w_2$, ..., $w_N$, supplied over a multi-link 15 by a performance monitoring and parameter updating digital signal processor (DSP) 16. DSP executes 16 one or more error minimization algorithms (e.g., power or least mean square) for controllably adjusting the distortion introduced into the RF signal input path through the predistortion unit 14.

The output of RF power amplifier 10 is coupled to an RF output port $RF_{out}$, and through a second directional coupler 17 to a first input 31 of a mixer 32 within a controllably tuned or swept output receiver 30. The output of the directional coupler 17 is representative of the amplified original RF input signal and any intermodulation (spectral regrowth) distortion products (IMDs) introduced by the RF amplifier.

Each of the input and output receivers 20, 30 is controlled by a digital sweep-control signal generated by the DSP 16. For this purpose, digital sweep-control signal lines 17 are coupled to a digital-to-analog converter (DAC) 41, which produces an analog output sweep voltage that is filtered in a low pass filter 43 and coupled to a voltage controlled oscillator (VCO) 45. The output of the VCO 45 is coupled to an input port 51 of a Wilkinson splitter 50.

The Wilkinson splitter 50 has a first output port 52, which is coupled through a buffer amplifier 55 to a second input 23 of mixer 22, and a second output port 53, which is coupled through a buffer amplifier 57 to a second input 33 of mixer 32. The IF output 25 of mixer 22 is filtered by a wider band bandpass filter 61 and coupled through a buffer amplifier 63 to a carrier power detector 65, shown as a diode, whose cathode is capacitor-coupled to ground. The carrier power detector 65 has its output coupled to a threshold detector 67, the output of which is coupled to a blanking detector input 18 of the DSP 16, and to respective control ports 71, 81 of first and second, high isolation switches 70 and 80 within the output receiver 30.

In the absence of the output of the carrier power detector 65 exceeding a prescribed threshold associated with an RF carrier signal, the output of the threshold detector 67 is at a first logic state. However, if carrier power detector 65 detects power in excess of the prescribed threshold, the output of the threshold detector 67 changes to a second logic state. This change in state of the output of the threshold detector 67 controls the blanking signal input 18 to the DSP 16 so as to controllably blank the output receiver 30, through which RF amplifier distortion is measured.

To this end, the IF output 35 of mixer 32 is coupled to a first input port 72 of first isolation switch 70, a second input port 73 of which is impedance-terminated, as shown. The first high isolation switch 70 has an output port 74 coupled through a narrower band bandpass filter 75 to a first input port 82 of the second high isolation switch 80, a second input port 83 of which is impedance-terminated, as shown. Isolation switch 80 has an output port 84 coupled through an IF buffer amplifier 85 to a diode-configured (distortion) power detector 91, whose cathode is capacitor-coupled to ground, and which serves to measure the distortion power within the output receiver bandwidth generated by the RF amplifier 10.

The distortion power detection diode 91 has its output (cathode) coupled through a lowpass filter 93 to an analog-to-digital converter (ADC) 95, the digitized output of which is coupled over link 97 to a distortion detection input 19 of the DSP 16. This digitized output of the distortion power detection diode 91 is integrated and processed by the DSP 16 using one or more error minimization algorithms for controlling variable attenuator and phase shift components in predistortion unit 14.

In accordance with the operation of the controllably blanked distortion energy measurement subsection 100, the signal path through the output receiver 30 is normally coupled through the first and second isolation switches 70 and 80 to the distortion power detection diode 91. The output of power detection diode 91 is sampled, digitized and coupled to the distortion input 19 of the DSP 16. As the DSP 16 sweeps the control voltage input to the VCO 45, the tuning frequency for each of the input and output receivers 20 and 30 is swept in common. During this frequency sweep, the power detected by the carrier power detector diode 65 of the input receiver 20 is applied to threshold detector 67, whose threshold differentiates between carriers and distortion.

As long as the threshold of the threshold detector 67 is not exceeded, it is inferred that the output of the receiver 30 is the distortion power produced in the RF power amplifier 10. This distortion power is digitized and coupled to the processor 16, and integrated over an entire sweep for controlling the predistortion correction unit 14. However, when the output of the carrier power detector 65 exceeds the threshold of threshold detector 67—indicating that the output receiver is tuned near carrier energy—the output of the threshold detector 67 changes state. This change of state signal blanks the DSP 16 and causes the signal paths through the isolation switches 70 and 80 to be interrupted, effectively blanking the output receiver 30, so that the distortion correction operation performed by the DSP 16 is not affected by the carrier.

This, selective, carrier-based blanking of the distortion measurement receiver circuitry effectively prevents saturation of the output receiver's IF amplifier 85, and allows the use of lower IP3 components. The bandwidth of the input receiver 20, which is dictated by the bandpass filter 61, may be made slightly wider than the bandwidth of the output receiver 30 to provide a guardband, as appropriate, for the switching operation.

In the architecture of FIG. 1, the high isolation switches 70 and 80 serve to improve the dynamic range of the receiver in two ways. First, they prevent the IF components from being overloaded by the carrier, as the carrier is swept through the IF passband. This undesirable overload would drive the amplifiers and the detectors into saturation, and these elements would require some period of time to leave saturation, and re-enter normal, active-mode operation. Secondly, the isolation switches prevent the bandpass filter circuitry from being excited by a sudden transient, as the carrier is swept into the IF passband. As the bandpass filter is a relatively narrow, highly resonant filter, such step transients would cause the filter to 'ring' over a relatively long decay time.

Both of these effects may cause an error in ACPR measurement in that portion of the spectrum immediately adjacent to the desired carriers. Unfortunately, this also happens to be the region within the spectrum where most of the IMD caused by the RF power amplifier is concentrated, and where minimization of IMDs is most desirable. The effect of such an error could cause optimization of ACPR to be unbalanced between the two sidebands surrounding a carrier. One sideband might become optimized to a better-than-required ACPR at the expense of performance in the other sideband.

This effect is most undesirable where all of the energy of one or more of the carriers is capable of passing entirely within the bandwidth of the IF filter (namely, the ratio of carrier C bandwidth to IF bandwidth is low). This will result in maximized ringing in the bandpass filter. It is also undesirable in multi-carrier amplifiers, where more receive dynamic range is required, since some carriers have all of their energy confined to a relatively small bandwidth, while other carriers have their energy 'spread' over a considerable bandwidth (e.g., IS-95 CDMA).

The effect of the error is further undesirable where a high C/I ratio (on the order of greater than 50 dB) of the amplifier system is specified, which also requires a high dynamic range. Finally, this effect is undesirable where a very fast VCO sweep rate is required, and it would not be practical or beneficial to slow the sweep rate.

SUMMARY OF THE INVENTION

There exist situations where only a small number of wideband signals (e.g., five) are present and slow frequency sweeping is acceptable. Pursuant to the present invention, in such situations, the above-described benefits of using high isolation switches in the signal flow path of the output receiver of the performance measurement and correction architecture of the above-referenced '723 application are not required. In these cases, the architecture of the '723 application may be simplified by replacing the controllably blanked isolation switches of the swept output receiver with buffer amplifier—filter stages. The buffer amplifier-filter stages provide additional gain to offset the very low signal level extracted from the RF amplifier, and prevent the production of IMDs in the swept receiver's mixer.

As will be described, in the 'switchless' distortion measurement and correction architecture of the present invention, the Wilkinson splitter that is used to couple the swept oscillator to the respective mixers of the input and output receivers is replaced by a resistive Y splitter, which has a flatter frequency response than a Wilkinson splitter, and enables the output level of the VCO to be held constant as it is swept over frequency. In addition, the input and output signal paths through the input receiver's mixer are coupled through one or more cascaded buffer amplifier stages, to improve reverse isolation and prevent the VCO signal from coupling back into the input path to the RF amplifier. Also, parameters of the input receiver's amplifier stages and the bandpass filters are selected to avoid damaging any of the components.

Further, the DSP uses sampled input power information to control the threshold setting of the threshold detector. Adapting the threshold to sampled input power provides the DSP with the ability to adapt the carrier detection threshold to different power levels. In addition, the high isolation switches of the swept output receiver are removed, and the IF output of the output receiver's mixer is coupled through a cascaded arrangement of amplifier gain stages and band bandpass filters.

The bandpass filters of the output receiver can be made identical to the bandpass filter in the swept input receiver. This makes the output receiver's bandwidth slightly narrower than the input receiver, and helps minimize the number of different parts used in the circuit. In both the input and output receivers, the gains of the receiver amplifier stages and the losses through the bandpass filters are selected so as to avoid damaging the power detection diode and any other components.

DETAILED DESCRIPTION

Figure 1:
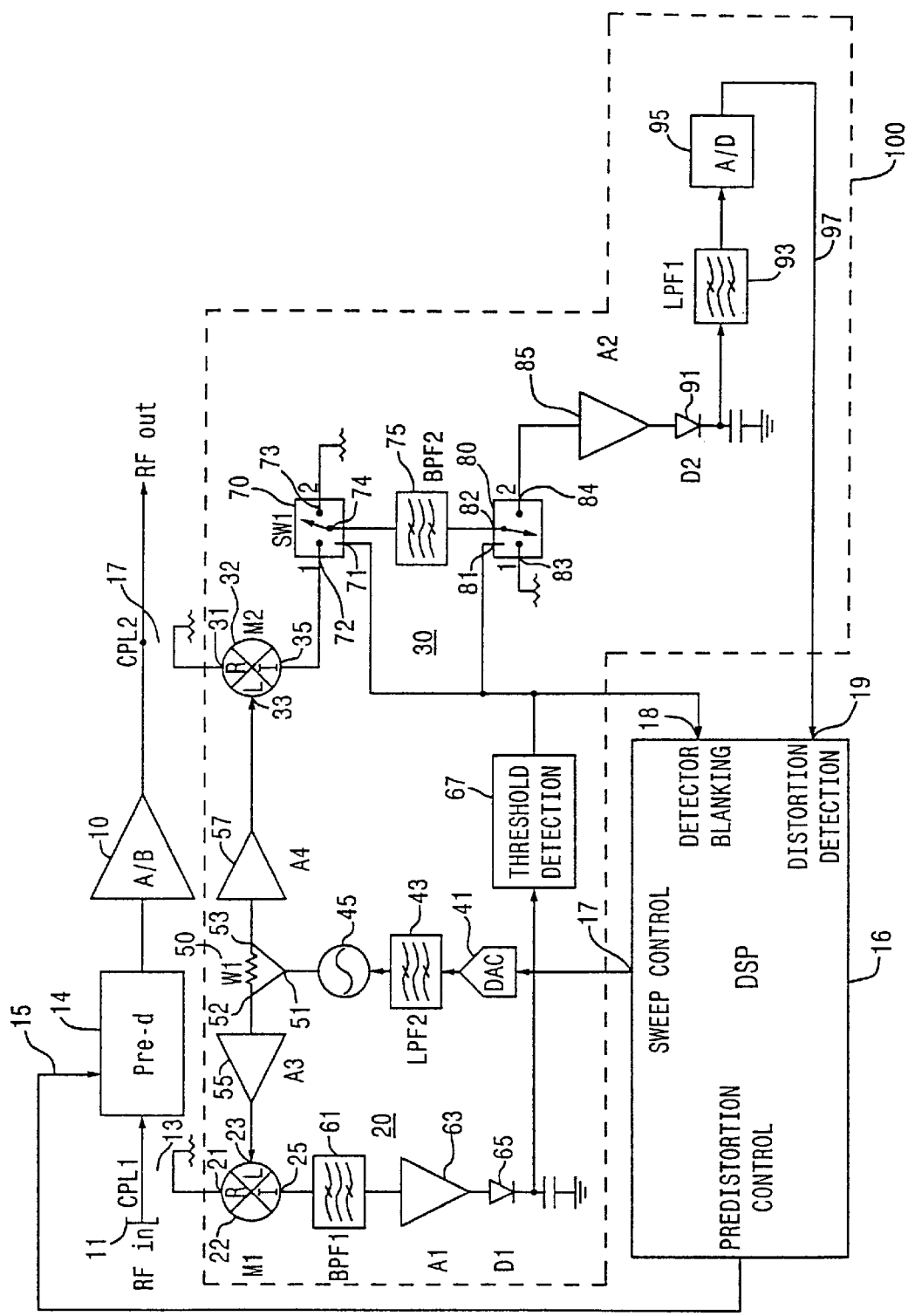
FIG. 1 diagrammatically illustrates an RF power amplifier distortion measurement and pre-distortion correction scheme in accordance with the invention described in the above-referenced '723 application)

Before describing in detail the new and improved 'switchless' RF power amplifier distortion measurement and correction mechanism of the present invention, it should be observed that the modified scheme of the invention resides primarily in a prescribed arrangement of conventional RF communication circuits, associated digital signal processing components and attendant supervisory control circuitry, that controls the operation of such circuits and components. As a result, the configuration of such circuits components, and the manner in which they interface with other communication system equipment have, for the most part, been illustrated in the drawings by readily understandable block diagrams, which show only those details that are pertinent to the present invention, so as not to obscure the disclosure with details which will be readily apparent to those skilled in the art having the benefit of the description herein. Thus, the block diagram illustrations are primarily intended to show the major components of an RF amplifier distortion measurement and correction system in a convenient functional grouping, whereby the present invention may be more readily understood.

Figure 2:
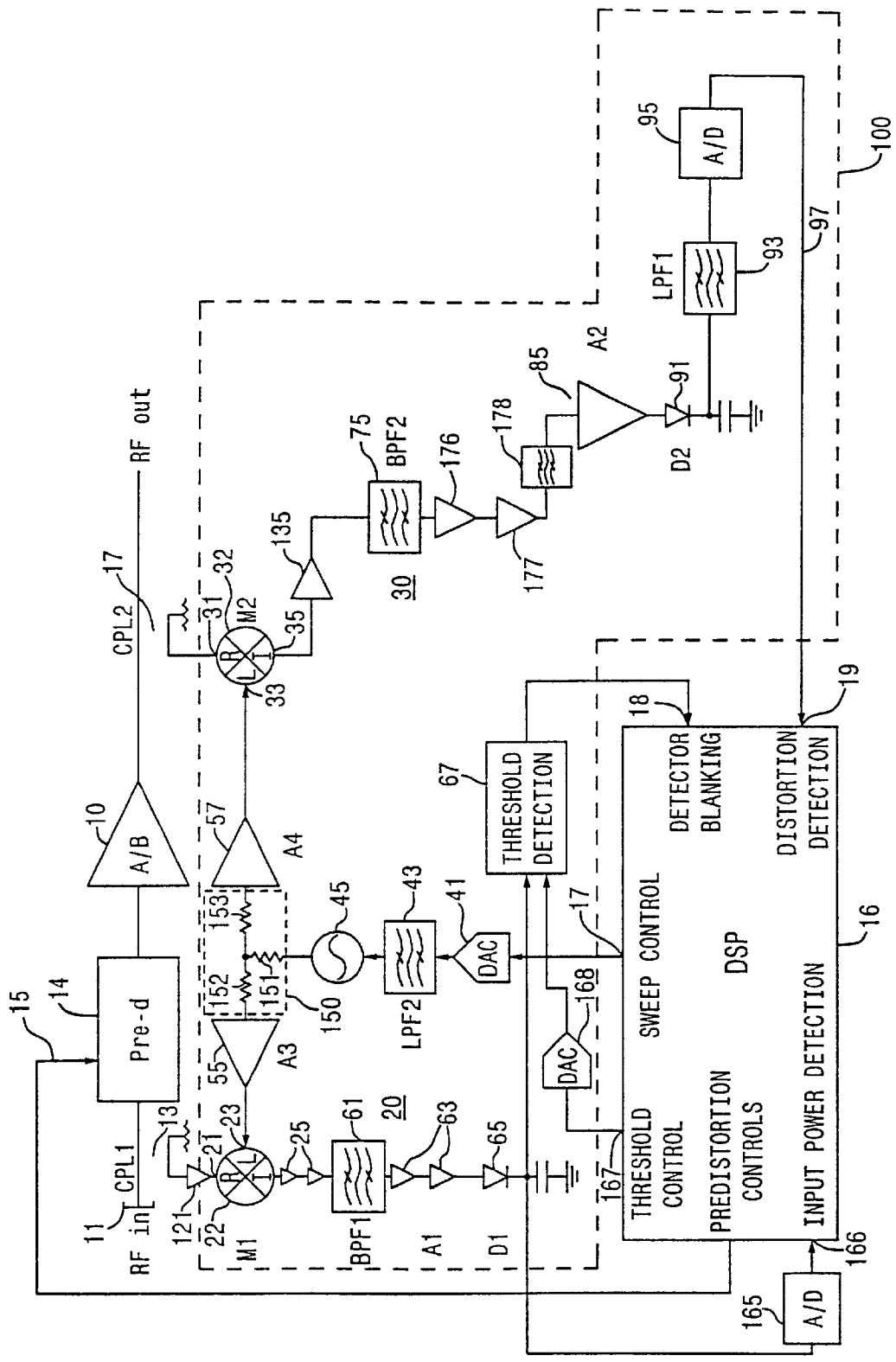
FIG. 2 diagrammatically illustrates a modification of FIG. 1 to realize the switchless RF power amplifier distortion measurement and correction scheme of the invention.

Attention is now directed to FIG. 2, which diagrammatically illustrates a switchless version of the RF power amplifier distortion measurement and correction scheme of FIG. 1. As in the circuit of FIG. 1, amplifier distortion is corrected by means of an adaptive predistortion circuit 14 installed in the input path 11 to RF amplifier 10, which has a relatively "low" carrier-to-intermod ratio (C/I). As pointed out above, by relatively low C/I ratio RF amplifier is meant an amplifier whose RF carrier level is effectively indistinguishable from that of intermodulation products, and may be considered to apply to RF amplifiers having intermodulation products above −50 dBC.

The switchless architecture of FIG. 2 differs from the distortion measurement and correction scheme of FIG. 1 in the following respects. First, the Wilkinson splitter 50 used to coupled the output of the swept oscillator 45 to swept input and output receivers 20 and 30, respectively, is replaced by a resistive Y splitter 150, which has a flatter frequency response than a Wilkinson splitter, and thus complies with the desire to maintain the output level of the VCO 45 constant as it is swept over frequency. The resistive Y splitter 150 has a first resistor arm 151 coupled to the output of oscillator 45. A second resistor arm 152 is coupled through buffer amplifier 55 to the second input 23 of the input receiver's mixer 22. A third resistor arm 153 is coupled through buffer amplifier 57 to the second input 33 of the output receiver's mixer 32.

Pursuant to a second aspect of the invention, the input signal path through the coupler 13 to the input mixer 22 is coupled through one or more cascaded buffer amplifier stages 121, which serve to improve reverse isolation and prevent the VCO signal from coupling back through directional coupler 13 into the input path to the RF amplifier 10. The gains of the input receiver's amplifier stages 121, 125 and 63 and the losses through the coupler 13, mixer 22 and bandpass filter 61 are selected so as to strategically avoid damaging any of the components.

Thirdly, in addition to being coupled to the threshold detector 67, the output of the carrier power detector 65 is digitized by an ADC 165, the digitized output of which is coupled to an input power detection input 166 of the DSP 16. The DSP 16 uses this sampled input power information to generate a threshold setting, which is coupled by way of a threshold control output port 167 through a DAC 168 to the threshold detector 67. Providing an adaptive threshold based upon sampled input power provides the DSP with the ability to adapt the carrier detection threshold to different power levels.

In accordance with a fourth modification of the invention, the high isolation switches 70 and 80 of the swept output receiver 30 are removed. To this end, the IF output 35 of the output receiver's mixer 32 is coupled through a cascaded arrangement of amplifier gain stages and narrower bandpass filters. As a non-limiting example, the mixer output 35 may be coupled through an amplifier stage 135 through a band bandpass filter 175 to cascaded amplifier stages 176 and 177. The output of the amplifier stage 177 may be coupled through a further band bandpass filter 178 to the IF buffer amplifier 85. These additional gain stages are employed since the signal level extracted from output coupler 17 is very low to avoid producing IMDs in the mixer 32. The bandpass filters 175 and 177 can be made identical to the bandpass filter 61 in the swept input receiver. This makes the output receiver's bandwidth slightly narrower than the input receiver, and helps minimize the number of different parts used in the circuit. As in the input receiver, the gains of the receiver amplifier stages and the losses through the bandpass filters are selected, so as to avoid damaging the power detection diode 91 and any other components (for example, where the cascaded amplifier, filter and detector stages of the IF section are driven into hard saturation). For example, the saturated output power capability of amplifier stage 85 may be on the order of 12–13 dBm, while detector 91 may be capable of safely absorbing an input of 17 dBm.

In operation, the signal path through the buffer amplifier and bandpass filter stages of the output receiver 30 to the distortion power detection diode 91 is sampled, digitized and coupled to the distortion input 19 of the DSP 16. As in the circuit of FIG. 1, as the DSP 16 sweeps the control voltage input to the VCO 45, the tuning frequency for each of the input and output receivers 20 and 30 is swept in common. During this frequency sweep, the power detected by the carrier power detector diode 65 of the input receiver 20 is applied to threshold detector 67, whose controlled threshold setting serves to differentiate between carriers and distortion. As long as the established threshold of the threshold detector 67 is not exceeded, it is inferred that the output of the receiver section 30 is representative of the distortion power produced in the RF power amplifier 10. This distortion power representation is digitized and coupled to the processor 16, which uses this information as the basis for controlling the predistortion correction circuitry 14 in the input path to the amplifier 10.

When the output of the carrier power detector 65 exceeds the threshold of threshold detector 67 (indicating that the output receiver is tuned near carrier energy), the output of the threshold detector 67 changes to its second logic state. This change of state signal is supplied to the blanking input 18 of DSP 16, and prevents the distortion correction operation performed by the DSP 16 from being affected by the carrier.

In the architecture of FIG. 2, the bandwidth of the carrier (which may be on the order of 8 MHz, as a non-limiting example) is relatively 'large' compared to the IF passband width (which may be on the order of 250 KHz). The RF amplifier 10 may comprise a single-carrier, single-mode (W-CDMA only) amplifier, whose C/I specification is relatively low (e.g. on the order of 40 dB at the carrier edges). Also, the sweep rate of the VCO 45 is relatively slow (e.g., requiring twenty milliseconds to sweep from the edge of carrier to a scan location several MHz away), compared to the decay of the bandpass filter (in relation to its group delay, which may be on the order of one millisecond).

As will be appreciated from the foregoing description of the switchless distortion measurement and correction architecture of the present invention, the unnecessary complexity of using high isolation switches in the signal flow path of the output receiver in certain applications of the invention described in the above-referenced '723 application may be effectively obviated by replacing the controllably blanked isolation switches of the swept output receiver with buffer amplifier—passband filter stages. These buffer-filter stages not only function to provide additional gain to offset the fact that the signal level extracted from the output amplifier is very low, and to prevent producing IMDs in the swept receiver's mixer, but may be implemented of the same bandpass filter in the swept input receiver. This makes the output receiver's bandwidth slightly narrower than the input receiver, and serves to minimize the number of different parts used in the circuit. In both the input and output receivers, the gains of buffer amplifier stages and the losses through the bandpass filters are selected, so as to avoid damaging any other components. Like the architecture of the '723 application, the switchless, swept oscillator configuration of the present invention enables RF power amplifier distortion to be accurately measured, even in the presence of multi-frequency input signals.

While I have shown and described an embodiment in accordance with the present invention, it is to be understood that the same is not limited thereto but is susceptible to numerous changes and modifications as are known to a person skilled in the art, and I therefore do not wish to be limited to the details shown and described herein, but intend to cover all changes and modifications as are obvious to one of ordinary skill in the art.

What is claimed is:

1. An RF power amplifier arrangement comprising:
   an RF input port to which an RF input signal is applied;
   an RF output port from which an amplified RF output signal is derived; and
   an RF signal processing path coupled between said input and output ports, and containing an RF power amplifier and an RF distortion correction unit, that is controllably operative to adjust one or more parameters of said RF signal processing path, so as to compensate for distortion introduced by said RF power amplifier, said RF distortion correction unit being coupled to derive information representative of said distortion introduced by said RF power amplifier over a prescribed bandwidth, but excluding the effect of an RF carrier frequency of said RF input signal, and including a frequency swept output receiver coupled to monitor energy contained in said amplified RF output signal, and being coupled over a non-interrupted output signal path that supplies information representative of said distortion introduced by said RF power amplifier over said prescribed bandwidth.

2. An RF power amplifier arrangement according to claim 1, including an adjustable threshold detector that is operative to controllably interrupt operation of said RF distortion correction unit, in response to said RF output signal containing RF carrier energy in excess of a controllably selectable threshold.

3. An RF power amplifier arrangement according to claim 2, wherein said RF distortion correction unit includes an RF predistortion correction unit that controllably imparts distortion onto said RF input signal upstream of said RF amplifier, so as to cancel the distortion contributed by said RF amplifier.

4. An RF power amplifier arrangement according to claim 3, wherein said RF distortion correction unit further includes a frequency swept input receiver coupled to monitor energy contained in said RF input signal, and wherein said controllably selectable threshold of said adjustable threshold detector is determined in accordance with energy contained in said RF input signal.

5. An RF power amplifier arrangement according to claim 1, wherein said RF signal processing path includes a swept input receiver coupled to measure carrier power at said input port, a swept output receiver, having an operational bandwidth less than that of said swept input receiver, and being coupled to measure distortion energy at said output port, and a swept local oscillator that is operative to sweep the frequency of operation of each of said input and output receivers in common.

6. An RF power amplifier arrangement according to claim 5, including an adjustable threshold detector that is operative to controllably interrupt operation of said RF distortion correction unit, in response to said RF output signal containing RF carrier energy in excess of a controllably selectable threshold.

7. An RF power amplifier arrangement according to claim 6, wherein said controllably selectable threshold of said adjustable threshold detector is determined in accordance with energy contained in said RF input signal.

8. An RF power amplifier arrangement according to claim 7, wherein said RF distortion correction unit includes a predistortion correction unit coupled in an input path of said amplifier, and being operative to controllably impart distortion onto an input signal upstream of said amplifier, so as to cancel distortion contributed by said amplifier, in accordance with said distortion energy measured by said swept output receiver.

9. An RF power amplifier arrangement according to claim 5, wherein said swept output receiver is coupled through a first buffer amplifier and narrowband filter circuit arrangement to an RF predistortion correction processor, operation of which is controllably interrupted by said adjustable threshold detector, in response to said RF output signal containing RF carrier energy in excess of said controllably selectable threshold.

10. An RF power amplifier arrangement according to claim 9, wherein a signal path from said input port through said swept input receiver to said RF predistortion correction processor is coupled through a second buffer amplifier and narrowband filter circuit arrangement.

11. An RF power amplifier arrangement according to claim 10, wherein said first and second buffer amplifier and narrowband filter circuit arrangements employ the same narrowband filter circuit components.

12. A method of measuring and compensating for distortion in an RF power amplifier to an input port of which an RF input signal is coupled and from an output port of which an amplified RF output signal is derived, said method comprising the steps of:

(a) deriving information representative of said distortion introduced by said RF power amplifier over a prescribed bandwidth, by varying the frequency of operation of an output receiver that is coupled in an uninterrupted output signal path through which energy contained in said amplified RF output signal may be monitored, and extracting therefrom said information representative of said distortion introduced by said RF power amplifier over said prescribed bandwidth; and (b) controllably adjusting one or more parameters of said RF signal processing path so as to compensate for distortion introduced by said RF power amplifier, in accordance with said information derived in step (a) and excluding said RF carrier frequency.

13. A method according to claim 12, wherein step (a) further includes controllably interrupting the derivation of information representative of said distortion introduced by said RF power amplifier, in response to said RF output signal containing RF carrier energy in excess of a controllably selectable threshold.

14. A method according to claim 13, wherein step (b) includes controlling the operation of an RF predistortion correction unit installed in said RF input signal upstream of said RF amplifier, so as to cancel the distortion contributed by said RF amplifier.

15. A method according to claim 13, wherein step (a) includes monitoring energy contained in said RF input signal through a frequency swept input receiver, and establishing said controllably selectable threshold in accordance with energy contained in said RF input signal.

16. A method according to claim 13, wherein step (a) comprises deriving said information through a swept input receiver that is coupled to measure carrier power at said input port, a swept output receiver, having an operational bandwidth less than that of said swept input receiver, that is coupled to measure distortion energy at said output port, and controlling the operation of a local oscillator so as to sweep the frequency of operation of each of said input and output receivers in common.

17. A method according to claim 16, wherein said swept output receiver is coupled through a first buffer amplifier and narrowband filter circuit arrangement to an RF predistortion correction processor, operation of which in performing step (b) is controllably interrupted by said adjustable threshold detector, in response to said RF output signal containing RF carrier energy in excess of said controllably selectable threshold.

18. A method according to claim 17, wherein a signal path from said input port through said swept input receiver to said RF predistortion correction processor is coupled through a second buffer amplifier and narrowband filter circuit arrangement.

19. A method according to claim 18, wherein said first and second buffer amplifier and narrowband filter circuit arrangements employ the same narrowband filter circuit components.

* * * * *